United States Patent [19]

Reichert, deceased

[11] Patent Number: 4,761,516
[45] Date of Patent: Aug. 2, 1988

[54] ELECTROMAGNETIC INTERFERENCE SHIELDING DEVICE

[75] Inventor: Gunther Reichert, deceased, late of Schwieberdingen, Fed. Rep. of Germany, by Sylvia Reichert, Legal Representative

[73] Assignee: Alcatel N.V., Amsterdam, Netherlands

[21] Appl. No.: 853,806

[22] PCT Filed: Jul. 27, 1985

[86] PCT No.: PCT/EP85/00378
§ 371 Date: Mar. 12, 1986
§ 102(e) Date: Mar. 12, 1986

[87] PCT Pub. No.: WO86/01069
PCT Pub. Date: Feb. 13, 1986

[30] Foreign Application Priority Data

Jul. 27, 1984 [DE] Fed. Rep. of Germany ....... 3427706

[51] Int. Cl.$^4$ ................................................ H05K 9/00
[52] U.S. Cl. .................................................. 174/35 GC
[58] Field of Search ............ 174/35 GC; 219/10.55 D; 361/424

[56] References Cited

U.S. PATENT DOCUMENTS

| 2,065,651 | 12/1936 | Burton ........................... 174/35 GC |
| 2,825,042 | 2/1958 | Tollefson et al. ......... 174/35 GC X |

FOREIGN PATENT DOCUMENTS

| 31578 | 12/1956 | Fed. Rep. of Germany ........ 174/35 GC |
| 1190521 | 4/1965 | Fed. Rep. of Germany . |
| 2522186 | 11/1976 | Fed. Rep. of Germany . |
| 3210843A1 | 10/1983 | Fed. Rep. of Germany . |
| 3219263 | 11/1983 | Fed. Rep. of Germany . |
| 909009 | 10/1962 | United Kingdom ........ 219/10.55 D |
| 2061624 | 5/1981 | United Kingdom . |

Primary Examiner—Arthur T. Grimley
Assistant Examiner—David A. Tone
Attorney, Agent, or Firm—Spencer & Frank

[57] ABSTRACT

A shielding device consists of a contact spring (1) having a triangular profile which is open at one triangular point. With the free legs (2, 3) the contact spring (1) is slipped over the edge of a housing member (10), such as a door, side wall, or the like. Following the closure or the assembly, one of the legs (2,3) is applied to the other housing member (12) forming a gap with the first member (10), which gap is to be conductively bridged.

19 Claims, 1 Drawing Sheet

4,761,516

ELECTROMAGNETIC INTERFERENCE SHIELDING DEVICE

BACKGROUND OF THE INVENTION

The invention relates to an electromagnetic interference shielding device in the form of a contract spring element for closing a gap or clearance between housing or covering-panel members of a cabinet or rack containing electronic equipment.

From German Pat. No. 2,039,681 there is known one such shielding device, which consists of spring contact elements freely cut out of a sheet metal strip having an L-shaped cross section. The shielding device is capable of being inserted into the grooves of housing members. One housing member, e.g. a corner profile, comprises specially shaped grooves in which the contact spring strips as well as the respective neighbouring housing members (closing plates) are slipped. With the aid of the contact spring strips, the housing members are connected in an electrically conductive manner and, at the same time, electromagnetic interference shielding for the interior of the housing is provided. The disclosed type of shielding device, however, is only suitable for use with fixed housing members, hence not with doors or similar moving parts.

For the electromagnetic interference shielding of door joints there is disclosed, for example, in the German Pat. No. 2,522,186, a sealing element which is disposed in the door. In this construction, behind an angled-off door edge, there is mounted a flexible ledge. Between this ledge and a parallel-extending angle section there is clamped the flap of an electrically conducting sealing strip which is rolled over at its free end and, in this part, may be filled with an elastic core. Upon closing the door, the rolled part is compressed and establishes the contact between the door and the housing.

Another door-joint shielding is known from German Offenlegungsschrift No. 3,219,263 which, however, is only for use on the hinge side. On this side, the door panel is bent at least semicircularly, with the rounding being covered by a spring plate connected on one hand to the door and, on the other hand, to the door frame.

Finally, from German Offenlegungsschrift No. 3,210,843, there is known a contact device for housing members capable of being moved in relation to one another, in which a knife-shaped extension of one housing member comes into snap-engagement with a groove lined with contact springs, of the other housing member.

SUMMARY OF THE INVENTION

It is the object of the invention to provide an electromagnetic interference shielding device which is easy to manufacture and to assemble, and which can be used for closing gaps or clearances between stationary as well as between movable housing members. This device is to ensure a good contact-making. On the other hand, when attached to a door, the closing pressure is not to become excessively high.

This object is achieved by providing a contact spring having a generally triangular profile that is open at one point. The legs adjacent the open point are slipped over an edge of one of the housing members forming a gap, and a leg is applied to another housing member forming the gap. The advantages of this solution reside in that it not only meets the given requirements, but that the contact springs, also without any special measures, are capable of being used on the housing members. That is, they are neither in need of the guiding grooves of special sections, nor of additional mounting means. The seating of the contact springs can be improved with the aid of small flaps engaging into simple openings, which is of particular advantage in the case of moving parts, such as doors.

DESCRIPTION OF THE PREFERRED EMBODIMENTS

Figure 1:
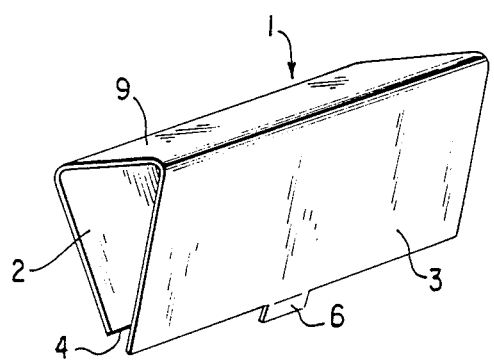
FIG. 1 shows a shielding device according to the invention in the shape of a contact spring, in a perspective representation.
Figure 3:
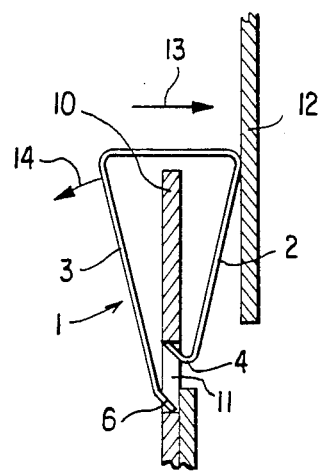
FIG. 3 is the cross-sectional view of a contact spring placed on to the edge of a door.
Figure 2:
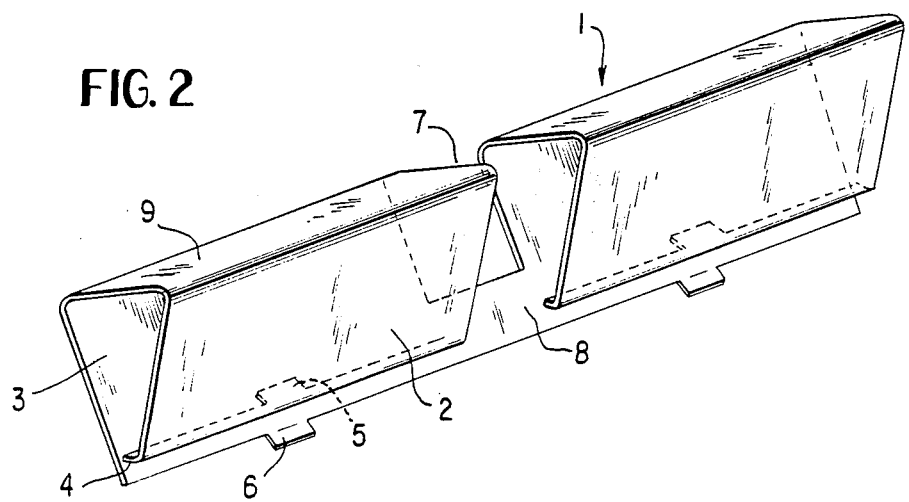
FIG. 2 shows a double contact spring resembling the one of FIG. 1, in perspective representation.

The contact springs 1 as shown in FIGS. 1 to 3 have a triangular profile which almost corresponds to that of an isosceles triangle. One of the triangular points is open, that is, where the two nearly equally long legs 2 and 3 form an acute angle. The leg 2 is bent off inwardly at its free end to form a narrow lip 4 extending almost in parallel with the connecting, short leg 9.

The free ends of the two legs 2 and 3 are each provided in their centers with a flap 5 or 6, each of which, in turn, is slightly bent toward the inside. While FIG. 1 shows one single contact spring 1, FIG. 2 shows a double contact spring 1 (as seen from the other side with respect to FIG. 1). The difference merely resides in that two contact springs are joined by a remaining web 8 on one of the legs. The two can be separated with the aid of a transversely extending incision 7 in the profile. The web 8 is appropriately within the edge area of the smooth leg 3. In this way, the contact spring 1 can be manufactured on a production line and then divided, in accordance with requirements, by cutting the web 8, into single, double or multiple contact springs. The contact spring 1 is made from a relatively thin spring plate, such as spring steel, spring bronze, etc. It is featured by small dimensions, a large spring deflection and a small pressure rise throughout the entire spring excursion. Its contact resistance is low-ohmic.

As is illustrated in FIG. 3, the contact spring 1 is simply slipped on to the edge of the housing member 10 and is self-lockingly retained in position by the flaps 5 and 6 engaging into the opening 11. In the normal position, the leg 2 is applied to the housing member 12. The housing member indicated by the reference numeral 10 is a door of a housing or cabinet or of the covering panel of a rack containing electronic equipment which, when being closed, is swivelled against the housing member or wall 12 of the housing in the direction as indicated by the arrow 13. The contact spring 1, in the course of this, deflects toward the other side as indicated by the arrow 14. By the contact spring 1 there is established a metallic connection in the gaps of the housing, so that all housing members or parts of the covering panels, such as doors, side walls, etc., are electrically connected among each other and to the racks, and are thus also grounded. At the same time, it is also easily possible to achieve RF shielding. Considering that the arrangement of the contact springs is variable, the spacings can be easily adapted to the frequencies in order thus to respectively obtain a complete shielding of the housing.

What is claimed is:

1. An electromagnetically shielded housing for electronic equipment, comprising:

first and second housing members with a gap between them, the first housing member having an edge and having an opening adjacent the edge; and a contact spring element to close the gap between the first and second housing members, the contact spring element having a profile with three legs disposed in a generally triangular configuration that is open at one point, the generally triangular configuration almost corresponding to the configuration of an isosceles triangle, two of the legs being adjacent the open point and being slipped over the edge of the first housing member, one of the legs being applied to the second housing member, wherein one of the legs adjacent the open point has a free end that is bent toward the interior of the triangle to form a narrow lip having, the lip having an inwardly angled-off flap, and wherein the other of the legs adjacent the open point has a free end with an inwardly angled-off flap, the flaps engaging the opening.

2. The shielding device in claim 1, wherein the contact spring element is elongated and has at least one transversely extending incision which divides the spring element so that only a connecting web remains in one of the legs adjacent the open point.

3. The shielding device of claim 1, wherein the first and second housing members comprise panels that are substantially parallel.

4. The shielding device of claim 1, wherein the first housing member has a predetermined thickness, and wherein the leg opposite the open point has a portion that is substantially straight when the contact spring element is not subjected to stress, the substantially straight portion of the leg opposite the open point having a length that substantially exceeds the thickness of the first housing member.

5. The shielding device of claim 6, wherein the contact spring element is pivotable with respect to the opening.

6. The shielding device of claim 5, wherein the flaps engage the opening by entering the opening.

7. An electromagnetically shielded housing for electronic equipment, comprising:

a first housing member having an edge and having an opening adjacent the edge;

a second housing member mounted adjacent the first housing member; and a contact spring element having a profile with three legs disposed in a generally triangular configuration that is open at one point, the triangle being substantially isosceles and the open point being at the apex thereof, wherein two of the legs are adjacent the open point and are slipped over the edge of the first housing member, wherein one of the legs rests against the second housing member, wherein one of the legs adjacent the open point has a free end that is bent toward the interior of the triangle to form a narrow lip, the narrow lip having an inwardly angled-off flap which engages the opening in the first housing member, and wherein the other leg adjacent the open point has an inwardly angled-off flap which engages the opening in the first housing member.

8. The shielded housing of claim 7, wherein the contact spring element is elongated and has at least one transversely extending incision which divides the spring element so that only a connecting web remains in one of the legs adjacent the open point.

9. The shielded housing of claim 7, wherein the housing members and the contact spring element are conductive, and wherein the contact spring element electrically connects the housing members.

10. The shielded housing of claim 7, wherein the housing members have surfaces that are substantially parallel.

11. An electromagnetically shielded housing for electronic equipment, comprising:

a first housing member having inner and outer sides and having an edge between the inner and outer sides;

a second housing member mounted adjacent the first housing member; and a contact spring element made of sheet metal and having an outer leg with a free end, an inner leg with a free end, and a connecting leg which joins the inner and outer legs so that the free ends thereof are directed towards one another, the connecting leg having a length that is substantially greater than the distance between the inner and outer sides of the first housing member, the contact spring element additionally having mounting means disposed on at least one of the free ends for pivotably mounting the contact spring element on the first housing member, the free end of the outer leg being in contact with the outer side of the first housing member, the free end of the inner leg being in contact with the inner side of the first housing member, the connecting leg being spaced apart from the edge of the first housing member, and the inner leg resiliently engaging the second housing member.

12. The shielded housing of claim 11, wherein the first panel has an opening adjacent the edge, and wherein the mounting means comprises a flap extending from at least one of the free ends into the opening.

13. The shielded housing of claim 11, wherein the first panel has an opening adjacent the edge, and wherein the mounting means comprises a flap extending from the free end of the outer leg into the opening and another flap extending from the free end of the inner leg into the opening.

14. The shielded housing of claim 13, wherein the inner leg is bent toward the outer leg to provide a narrow lip adjacent the free end.

15. The shielded housing of claim 11, wherein the inner leg is bent toward the outer leg to provide a narrow lip adjacent the free end of the inner leg.

16. The shielded housing of claim 15, wherein the first panel has an opening adjacent the edge, and wherein the mounting means comprises a flap extending from the lip into the opening.

17. The shielded housing of claim 16, wherein the mounting means further comprises another flap extending from the free end of the outer leg into the opening.

18. The shielded housing of claim 17, wherein the contact spring element is generally configured as an isosceles triangle, having an open apex angle at the free ends of the inner and outer legs.

19. The shielded housing of claim 11, wherein the first and second housing members are panels that are substantially parallel.

* * * * *